United States Patent [19]

Feng

[11] Patent Number: 6,046,908

[45] Date of Patent: Apr. 4, 2000

[54] HEAT-RADIATING STRUCTURE OF POWER ADAPTER

[75] Inventor: Hsiu-Mei Feng, Taipei Hsien, Taiwan

[73] Assignee: Long Well Electronics Corp., Taipei Hsien, Taiwan

[21] Appl. No.: 09/148,328

[22] Filed: Sep. 4, 1998

[51] Int. Cl.[7] .................................................. H05K 7/20
[52] U.S. Cl. ..................... 361/707; 361/690; 361/710; 361/715; 361/730
[58] Field of Search .................................. 361/688–689, 361/690, 694–695, 704, 707, 709–711, 715, 727–728, 752

[56] References Cited

U.S. PATENT DOCUMENTS

| | | | |
|---|---|---|---|
| 4,109,294 | 8/1978 | Mason et al. | 361/752 |
| 4,471,898 | 9/1984 | Parker | 361/752 |
| 4,656,559 | 4/1987 | Fathi | 361/386 |
| 4,710,853 | 12/1987 | Reinhardt | 361/727 |
| 5,521,792 | 5/1996 | Pleitz et al. | 361/715 |
| 5,742,478 | 4/1998 | Wu | 361/704 |
| 5,903,435 | 5/1999 | Hsieh et al. | 361/704 |
| 5,909,358 | 1/1999 | Bradt | 361/707 |

*Primary Examiner*—Gregory Thompson
*Attorney, Agent, or Firm*—Varndell & Varndell, PLLC

[57] ABSTRACT

A heat-radiating structure of power adapter, including an outer housing, a front sealing board, a rear sealing board, a circuit board, a heat-conducting member and a bottom board. At least one side of the circuit board is connected with a heat-conducting member. The heat-conducting member is disposed between multiple heat-conducting rubbers and the outer housing and padded by an insulative heat-conducting sheet. A metal plate formed with thread hole is together with the heat-conducting member screwed in the outer housing. The heat-conducting rubber and insulative heat-conducting sheet serve to evenly conduct the heat to the outer housing. The exhaustion fan serves to suck in air to cool the metal plate in the outer housing so as to greatly increase the heat-radiating area and achieve a better heat-radiating effect.

5 Claims, 4 Drawing Sheets

HEAT-RADIATING STRUCTURE OF POWER ADAPTER

BACKGROUND OF THE INVENTION

The present invention relates to a heat-radiating structure of power adapter, and more particularly to a heat-radiating structure applicable to DC/AC adapter for achieving optimal heat-radiating effect.

A conventional DC/AC adapter has an outer housing in which a circuit board with power adapter is inserted. A heat-conducting plate is welded on one side of the circuit board. In addition, a heat-conducting plate is fixed on a lateral side of the housing by screws. The heat-conducting plates contact with the housing so as to conduct the heat generated by the heat source to the housing and dissipate the heat.

The heat-conducting plate contacts with the housing on only one single side so that the side contacting with the heat-conducting plate has a temperature higher than that of the other side of the housing. This makes the heat unevenly dissipated and only a poor heat-radiating effect is achieved.

SUMMARY OF THE INVENTION

It is a primary object of the present invention to provide a heat-radiating structure of power adapter, which is able to evenly conduct the heat.

It is a further object of the present invention to provide a heat-radiating structure of power adapter, which has greatly increased heat-radiating area so as to achieve optimal heat-radiating effect.

According to the above objects, the heat-radiating structure of power adapter of the present invention includes an outer housing, a front sealing board, a rear sealing board, a circuit board, a heat-conducting member and a bottom board. At least one side of the circuit board is connected with a heat-conducting member. The heat-conducting member is disposed between multiple heat-conducting rubbers and the outer housing and padded by an insulative heat-conducting sheet. A metal plate formed with thread hole is together with the heat-conducting member screwed in the outer housing. The heat-conducting rubber and insulative heat-conducting sheet serve to evenly conduct the heat to the outer housing. The exhaustion fan serves to suck in air to cool the metal plate in the outer housing so as to greatly increase the heat-radiating area and achieve a better heat-radiating effect.

The present invention can be best understood through the following description and accompanying drawings, wherein:

DETAILED DESCRIPTION OF THE PREFERRED EMBODIMENTS

Figure 2:
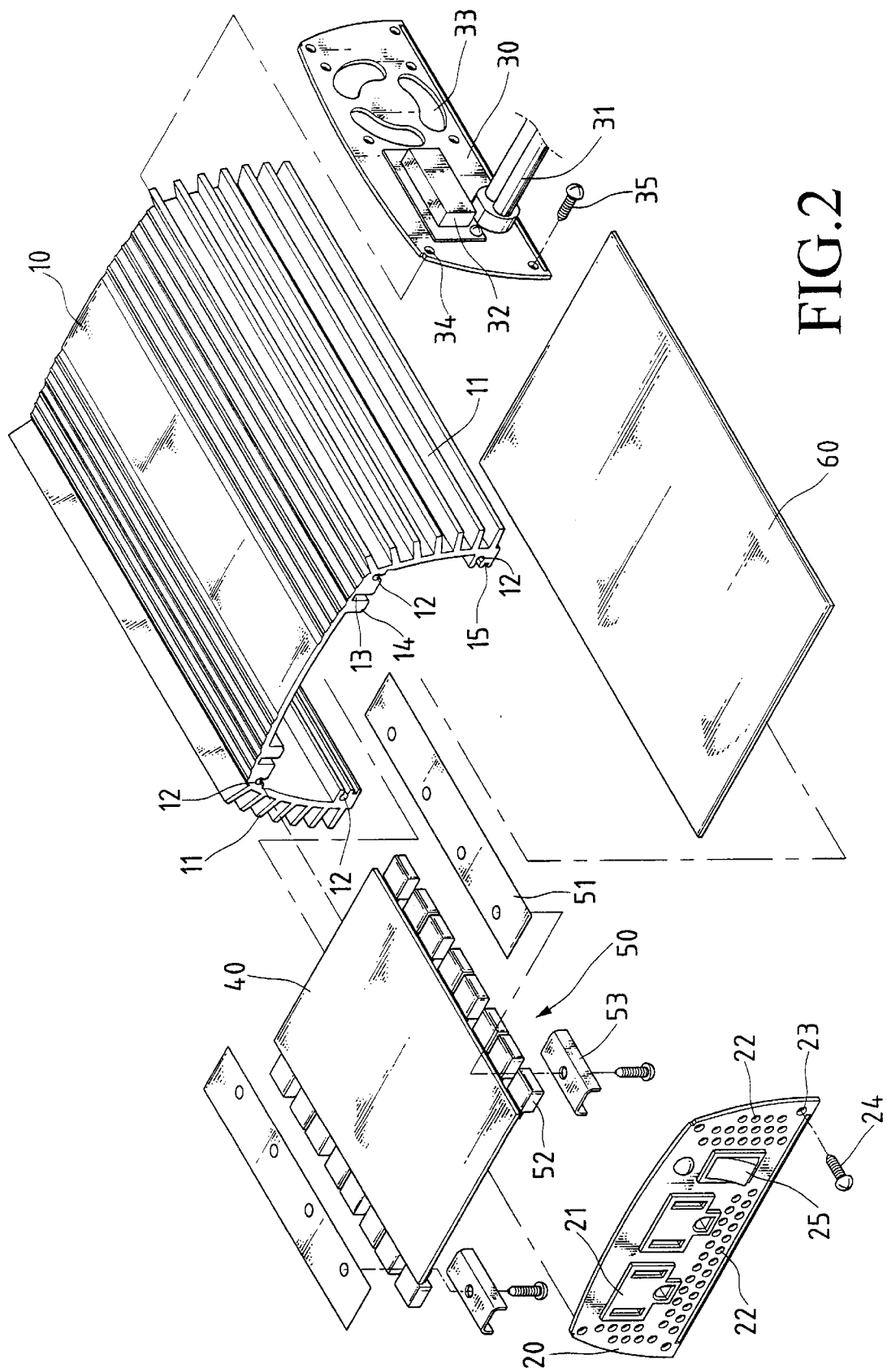
FIG. 2 is a perspective disassembled view of the present invention.

Please refer to FIG. 2. The present invention includes an outer housing 10, a front sealing board 20, a rear sealing board 30, a circuit board 40, a heat-conducting member 50 and a bottom board 60. The outer housing 10 is substantially trapezoid. Each lateral side of the outer housing 10 is disposed with multiple radially arranged heat-radiating fins 11 at equal intervals. The four corners of inner side of the outer housing 10 are respectively formed with open thread holes 12. Multiple locating thread holes 13 are disposed on the outer housing 10 and spaced from the open thread hole 12 on the top face by a certain distance. The locating thread holes 13 are perpendicular to the open thread hole 12. The end of the open thread holes on two sides of the top section are disposed with opposite slide grooves 14. The end of the open thread holes on two sides of the bottom section are disposed with opposite slide channels 15.

The front sealing board 20 is disposed with a socket 21 and switch 25 and formed with multiple vents 22. The four corners thereof are formed with thread holes 23 through which screws 24 are passed to lock the front sealing board 20 on the front open thread holes 12.

The rear sealing board 30 is disposed with a plug electric wire 31, fuse 32 and exhaustion fan 33. The four corners of the rear sealing board 30 are formed with thread holes 34 through which screws 35 are passed to lock the rear sealing board on the rear open thread holes 12.

The width of the circuit board 40 is equal to the distance between the slide channels 14 of the top section of the outer housing 10 so as to slidably locate in the slide grooves 14.

The heal-conducting member 50 is composed of insulative heat-conducting sheet 51, multiple heat-conducting rubbers 52 and multiple metal plates 53. Two ends of each metal plate 53 are bent upward so that the metal plate is substantially U-shaped. The center of the metal plate is formed with thread hole.

The bottom board 60 is a plane board body. The width of the bottom board 60 is equal to the distance between the slide channels 15 so as to slidably locate on the bottom of the outer housing 10.

Figure 1:
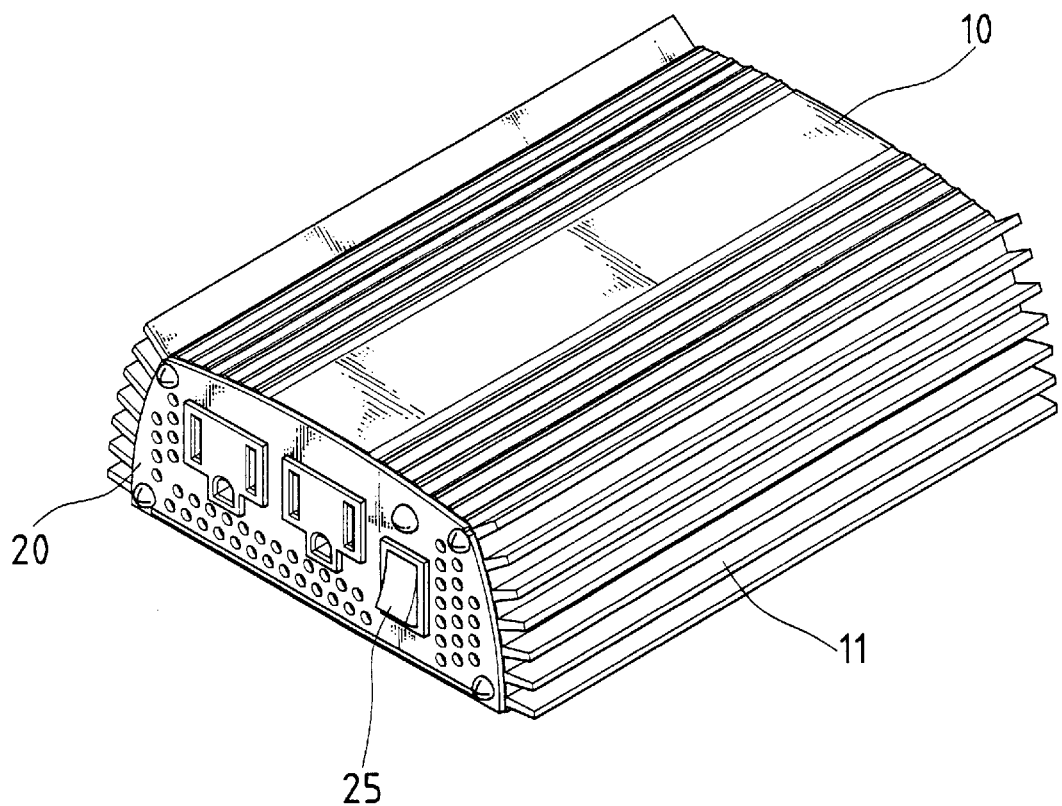
FIG. 1 is a perspective assembled view of the present invention.
Figure 3:
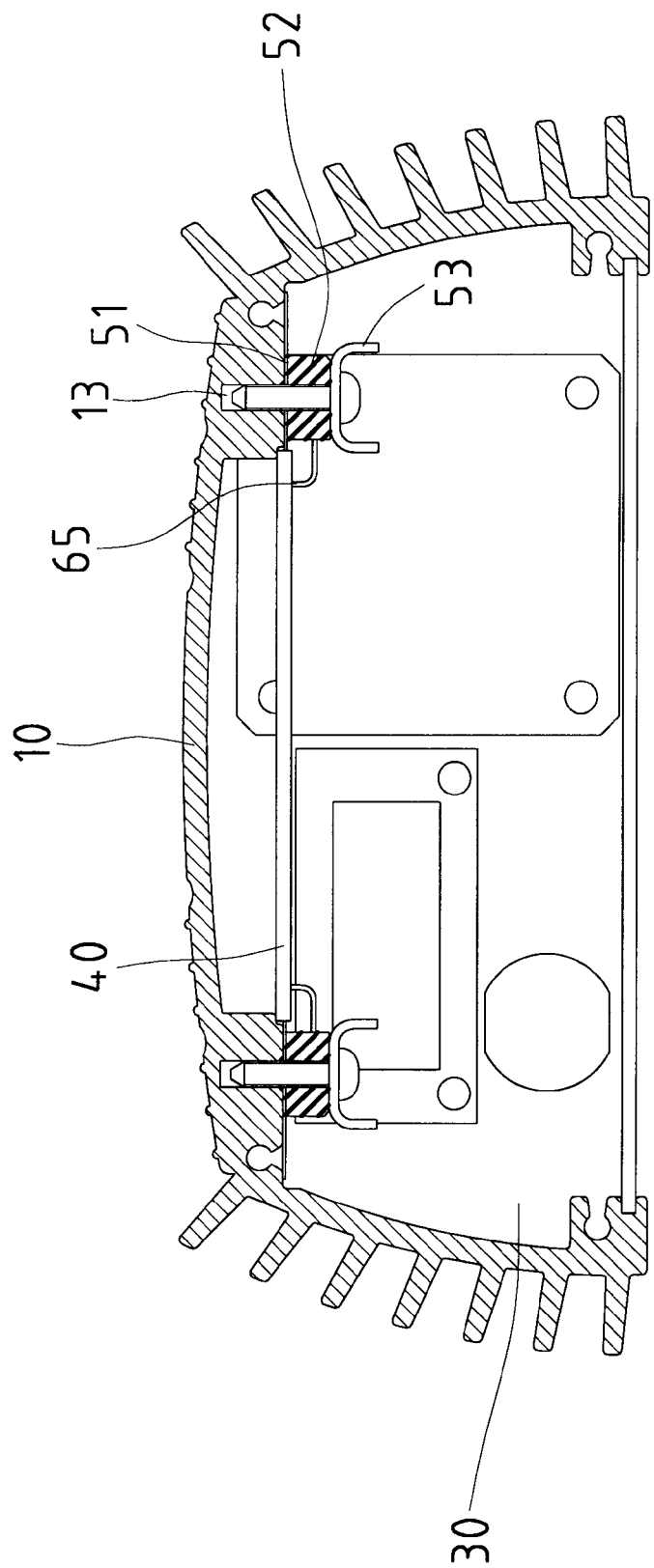
FIG. 3 is a sectional view of the present invention.

Referring to FIGS. 1 and 3, when assembled, each lateral side of the top section of the outer housing 10 having the locating thread hole 13 is paved with an insulative heat-conducting sheet 51. The multiple heat-conducting rubbers 52 and the metal plates 53 by a screw are located in the locating thread hole 13 of the outer housing 10. The circuit board 40 is slidably engaged in the slide grooves 14 of the top section of the outer housing 10. The heat-conducting rubber 52 is connected to the circuit board 40 by a metal wire 65. Accordingly, the heat is evenly and quickly dissipated outside through the contacting between the insulative heat-conducting sheet 51, heat-conducting conducting rubber 52 and the outer housing 10. Also, the exhaustion fan 33 of the rear sealing board 30 sucks in cool air from outer side so as to cool the metal plates 53 and achieve an excellent cooling effect and heat-radiating effect.

Figure 4:
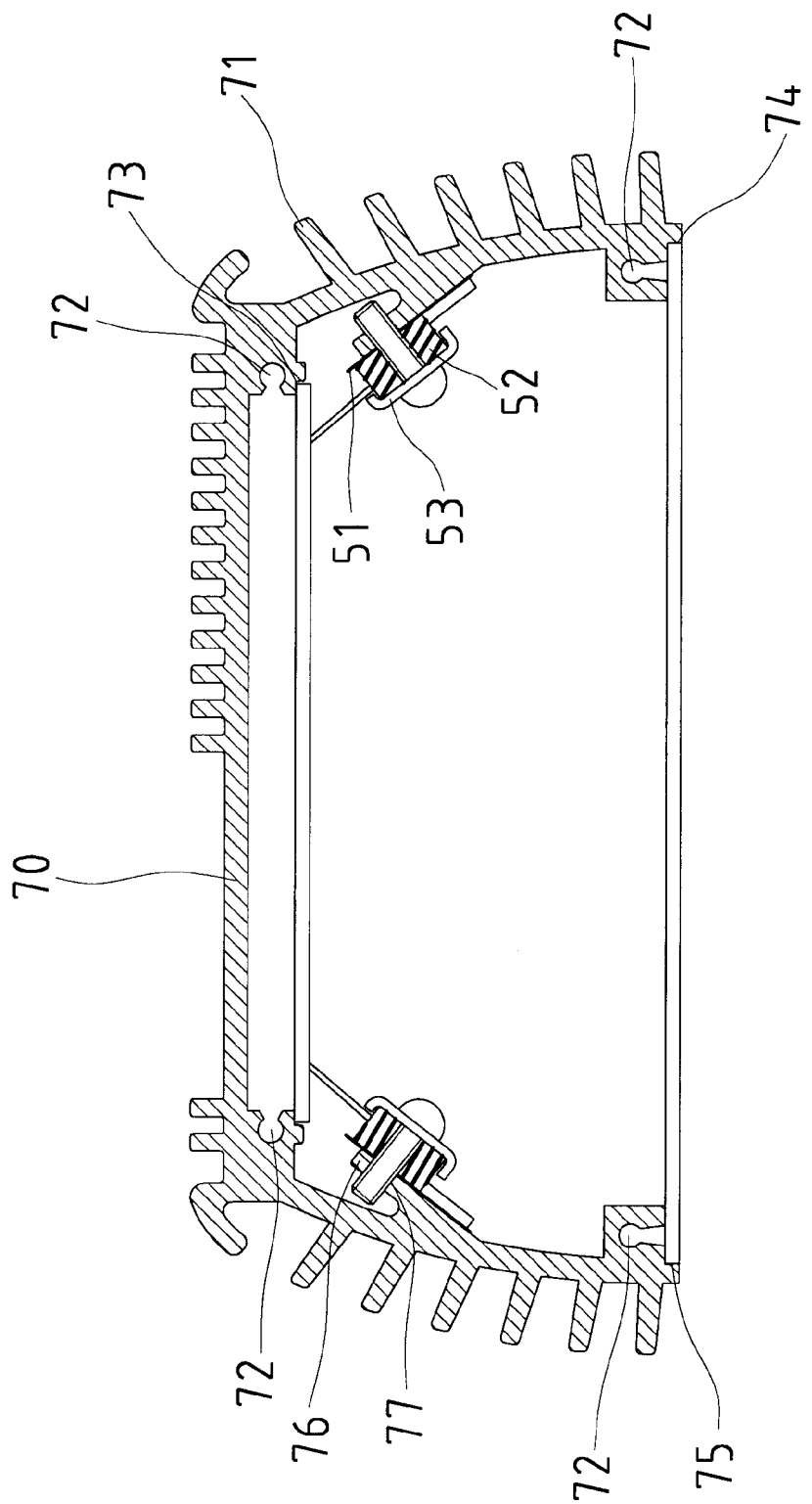
FIG. 4 is a sectional view of another embodiment of the present invention.

FIG. 4 shows another preferred embodiment of the present invention, in which each lateral side of the outer housing 70 is disposed with multiple radially arranged heat-radiatiing fins 71 at equal intervals. The four corners of inner side of the outer housing 70 are respectively formed with open thread holes 72. The ends of the open thread holes are respectively disposed with opposite slide channels 74, 75. The inner wall of each lateral side of the outer housing 70 is disposed with an inclined projecting plate 76 formed with locating thread holes 77 at equal intervals for locking the heat-conducting member 50 thereon so as to provide larger heat-radiating area and more quickly and effectively radiate the heat.

It should be noted that the above description and accompanying drawings are only used to illustrate some embodiments of the present invention, not intended to limit the scope thereof. Any modification of the embodiments should fall within the scope of the present invention.

What is claimed is:

1. An adapter, comprising:

an outer housing having lateral walls, a front sealing board, a rear sealing board, a circuit board, a heat-conducting members, and a bottom board, wherein an inner surface of each of the lateral walls comprises open thread holes and slide channels, multiple locating thread holes being formed on at least one side of a top section of the outer housing proximate to the open thread holes on at least one of the lateral walls;

wherein the front sealing board comprises a sockets, multiple vents, and thread holes to facilitate connection of the front sealing board to the front end of the outer housing;

wherein the rear sealing board comprises a plug electric wire, fuse, exhaustion fan and thread holes to facilitate connection of the rear sealing board to the rear end of the outer housing;

wherein the heat-conducting member comprises an insulative heat-conducting sheet, multiple heat-conducting rubbers and multiple metal plates;

at least one side of the circuit board being soldered with the multiple metal plates of the heat-conducting member;

wherein the multiple metal plates are sequentially connected to the locating thread holes of the outer housing; and wherein the bottom board comprises thread holes for connecting the bottom board to the outer housing by screws.

2. The adapter as claimed in claim 1, wherein the inner wall of each of the lateral walls of the outer housing comprises an inclined projecting plate having multiple locating thread holes.

3. The adapter as claimed in claim 2, wherein the inclined projecting plate forms an acute angle with a corresponding one of the lateral walls.

4. The adapter as claimed in claim 1, wherein each of the multiple metal plates comprises a front face and a back face, the front face being connected to the outer housing.

5. The adapter as claimed in claim 4, wherein the back face of each of the metal plates is is connected to the outer housing.

* * * * *